United States Patent
Ryu et al.

(10) Patent No.: US 10,566,675 B2
(45) Date of Patent: Feb. 18, 2020

(54) MOBILE TERMINAL

(71) Applicant: LG ELECTRONICS INC., Seoul (KR)

(72) Inventors: Seungwoo Ryu, Seoul (KR); Joohee Lee, Seoul (KR); Junyoung Jung, Seoul (KR); Youngryoul Kim, Seoul (KR); Wonwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/165,423

(22) Filed: Oct. 19, 2018

(65) Prior Publication Data

US 2019/0051967 A1 Feb. 14, 2019

Related U.S. Application Data

(63) Continuation of application No. 15/957,583, filed on Apr. 19, 2018, now Pat. No. 10,141,625.

(Continued)

(30) Foreign Application Priority Data

Jan. 5, 2018 (KR) .................. 10-2018-0001941

(51) Int. Cl.
*H01Q 1/02* (2006.01)
*H01Q 21/06* (2006.01)
*H01Q 1/24* (2006.01)
*H05K 1/18* (2006.01)
*H05K 1/02* (2006.01)
(Continued)

(52) U.S. Cl.
CPC .............. *H01Q 1/02* (2013.01); *H01Q 1/243* (2013.01); *H01Q 21/065* (2013.01); *H02J 7/025* (2013.01); *H05K 1/028* (2013.01); *H05K 1/0243* (2013.01); *H05K 1/181* (2013.01); *H05K 7/2039* (2013.01); *H05K 9/0026* (2013.01); *H04W 88/02* (2013.01); *H05K 2201/10098* (2013.01); *H05K 2201/10371* (2013.01)

(58) Field of Classification Search
CPC ......... H01Q 1/02; H01Q 1/243; H01Q 21/065
See application file for complete search history.

(56) References Cited

U.S. PATENT DOCUMENTS

| 4,256,792 A | 3/1981 | Koepke et al. |
| 2011/0006953 A1 | 1/2011 | Chiang et al. |

FOREIGN PATENT DOCUMENTS

| EP | 2090957 | 8/2009 |
| WO | 2015065117 | 5/2015 |
| WO | 2017034003 | 3/2017 |

OTHER PUBLICATIONS

European Patent Office Application Serial No. 18177197.3, Search Report dated Dec. 5, 2018, 10 pages.

*Primary Examiner* — Graham P Smith
(74) *Attorney, Agent, or Firm* — Lee, Hong, Degerman, Kang & Waimey PC

(57) ABSTRACT

A mobile terminal includes patch antennas forming an array, an integrated circuit (IC) controlling transmission and reception of radio signals of the patch antennas, and a case disposed to cover the IC, wherein the case includes: a base forming an appearance, a heat dissipation sheet attached to an inner surface of the base to dissipate heat generated in the IC and having an opening corresponding to the patch antennas, and a dielectric disposed to cover the opening and formed of a dielectric material to allow radio signals from the patch antennas to be radiated to the outside of the case.

20 Claims, 10 Drawing Sheets

Related U.S. Application Data

(60) Provisional application No. 62/531,890, filed on Jul. 13, 2017.

(51) Int. Cl.
*H05K 9/00* (2006.01)
*H02J 7/02* (2016.01)
*H05K 7/20* (2006.01)
*H04W 88/02* (2009.01)

MOBILE TERMINAL

CROSS-REFERENCE TO RELATED APPLICATIONS

This application is a continuation of U.S. patent application Ser. No. 15/957,583, filed on Apr. 19, 2018, now U.S. Pat. No. 10,141,625, which claims the benefit of U.S. Provisional Application No. 62/531,890, filed on Jul. 13, 2017, and also claims the benefit of earlier filing date and right of priority to Korean Application No. 10-2018-0001941, filed on Jan. 5, 2018, the contents of which are incorporated by reference herein in their entirety.

BACKGROUND OF THE INVENTION

1. Field of the Invention

The present disclosure relates to a mobile terminal having an antenna module.

2. Background of the Invention

A mobile/portable terminal is an electronic device which may be used while on the move and may be divided into a handheld terminal and a vehicle mounted terminal according to whether the user may carry the mobile phone directly.

Mobile terminals have various functions according to the development of technologies. For example, mobile terminals are implemented in the form of multimedia players having complex functions such as capturing an image or video, playing music or video files, playing games, and receiving broadcasts. Further, in order to support and enhance the functions of mobile terminals, improvement of structural parts and/or software parts of mobile terminals may be considered.

In recent years, with the provision of broadband services, there is a need for the mobile terminal to operate in a higher frequency band. In this regard, 5G (5G) communication services are being standardized recently, and the 5G antenna structures are newly designed and improved.

During an antenna operation, a great amount of heat is generated in an integrated circuit (IC). Thus, when an antenna structure is designed, a heat dissipation structure of the IC is a very important factor to be considered in terms of reliability of mobile terminals, as well as antennas.

Referring to FIG. 1, in the conventional 4G antenna structure for existing $4^{th}$-generation wireless communication services, an IC 12 is disposed apart from an antenna 11 by a predetermined distance or greater. Here, in order to upwardly dissipate heat from the IC 12, a heat dissipation sheet 13 is arranged to cover the IC 12. In this structure, the heat dissipation sheet 13 does not cover the antenna 11, radiation of the antenna 11 is not affected.

However, as illustrated in FIG. 2, in a 5G antenna structure, an IC 22 and an antenna 21 are arranged to be adjacent to each other (approximately 5 mm to 10 mm) to reduce path loss. Therefore, if a heat dissipation sheet 23 is disposed to cover the IC 22, the antenna 21 is also covered to cause a problem in which radiation of the antenna 21 is blocked.

SUMMARY OF THE INVENTION

It is a first object of the present disclosure to provide a structure in which an integrated circuit (IC) and an antenna are disposed to be adjacent to each other as in a 5G antenna structure for $5^{th}$ generation wireless communication services, but radiation of the antenna is not blocked, while heat generated in the IC is dissipated.

A second object of the present disclosure is to provide an antenna dissipation structure which includes a combination of different members and which has enhanced heat dissipation performance.

A third object of the present disclosure is to provide a novel antenna heat dissipation structure in which an upper heat dissipation structure and a lower heat dissipation structure of an IC (IC) are combined.

A fourth object of the present disclosure is to provide a case securing heat dissipation performance, without degrading performance of a 5G antenna module and a wireless charging module, in a mobile terminal.

To achieve the first object of the present disclosure, a mobile terminal includes: patch antennas forming an array; an integrated circuit (IC) controlling transmission and reception of radio signals of the patch antennas; and a case disposed to cover the IC, wherein the case includes: a base forming an appearance; a heat dissipation sheet attached to an inner surface of the base to dissipate heat generated in the IC and having an opening corresponding to the patch antennas; and a dielectric disposed to cover the opening and formed of a dielectric material to allow radio signals from the patch antennas to be radiated to the outside of the case.

The dielectric may be formed of a composite material including an aluminum nitride (AlN) or a boron nitride (BN).

The heat dissipation sheet may be a graphite sheet, a copper sheet, or an aluminum sheet.

The opening may be formed to be smaller than the dielectric, and the heat dissipation sheet may be disposed to cover an edge region of the dielectric.

Alternatively, the dielectric may be disposed to cover the periphery of the opening and the heat dissipation sheet may be disposed between the edge region of the dielectric and the base.

Alternatively, the dielectric may have a size corresponding to the opening and accommodated in the opening.

The dielectric may be disposed to be spaced apart from the patch antennas by a distance ranging from 1 mm to 3 mm.

An angle formed by the patch antennas and the opening with respect to an axis perpendicular to the patch antennas may be set to be greater than a scanning angle of the patch antennas.

The angle may exceed 60° and may be less than 90°.

The base may be formed of a synthetic resin material or a glass material.

In order to achieve the second object of the present disclosure, in a structure in which the dielectric and the heat dissipation sheet overlap vertically, a connection part is disposed in an overlap portion of the dielectric and the heat dissipation sheet.

The connection part may include an adhesive applied between the dielectric and the heat dissipation sheet; and a thermal compound filling an empty space in the adhesive.

Alternatively, in order to achieve the second object of the present disclosure, in a structure in which the dielectric has a size corresponding to the opening and is accommodated in the opening, a thermal compound is applied between the dielectric and the heat dissipation sheet.

The thermal compound may be applied to form a loop along the periphery of the dielectric.

In order to achieve the third object of the present disclosure, the mobile terminal may further include: a circuit board; a shield can disposed to cover the circuit board and formed of a metal material; a heat dissipation member supported on the shield can; and a flexible printed circuit board (FPCB) supported on the shield can and allowing the IC to be mounted thereon, wherein a ground via of the FPCB is in contact with the shield can and the shield can is in contact with a ground of the circuit board.

Alternatively, in order to achieve the third object of the present disclosure, the mobile terminal may further include: a circuit board; a shield can disposed to cover the circuit board and formed of a metal material; and a flexible circuit board (FPCB) supported on the heat dissipation member and allowing the IC to be mounted thereon, wherein the ground via of the FPCB is in contact with the heat dissipation member.

A thermal compound may be applied between the IC and the FPCB.

In order to achieve the fourth object of the present disclosure, a mobile terminal includes: an antenna module including patch antennas forming an array and an integrated circuit (IC) controlling transmission and reception of radio signals of the patch antennas; and a case disposed to cover the antenna module and having a wireless charging coil, wherein the case includes: a base forming an appearance; a heat dissipation sheet adhered to an inner surface of the base, surrounded by the wireless charging coil, and formed of carbon or a metal material; and a dielectric having an opening corresponding to the heat dissipation sheet and adhered to an inner surface of the base to overlap the antenna module and the wireless charging coil.

The dielectric may be formed of a composite material including an aluminum nitride to (AlN) or a boron nitride (BN).

The effects of the present disclosure obtained through the above-mentioned technical solution are as follows.

First, since the heat dissipation sheet is adhered to the inner surface of the base, the opening is formed in a portion of the heat dissipation sheet corresponding to the patch antennas, and the dielectric is disposed to cover the opening, the heat dissipation structure of the IC not affecting radiation performance of the patch antennas may be realized. In this case, when the dielectric is formed of a composite material containing an aluminum nitride (AlN) or a boron nitride (BN) having low electrical conductivity but high thermal conductivity, the dielectric material exhibits heat dissipation performance comparable to that of the heat dissipation sheet.

Second, in the structure in which the dielectric and the heat dissipation sheet overlap each other, the connection part including a combination of the adhesive and the thermal compound is disposed in the overlap portion, whereby heat transmission from the dielectric to the heat dissipation sheet is increased to enhance heat dissipation performance. In the structure in which the dielectric has a size corresponding to the opening and is accommodated in the opening, the thermal compound is applied between the dielectric and the heat dissipation sheet to exhibit the aforementioned effect.

Third, through the combination of an upper heat dissipation structure of the aforementioned IC and a lower heat dissipation structure including the IC, the ground via of the FPCB, the shield can, and a ground of the circuit board or a lower heat dissipation structure including the IC, the ground via of the FPCB, and the heat dissipation member, heat dissipation performance of the antenna module may be enhanced.

Fourth, since the dielectric is disposed to correspond to the wireless charging coil and the 5G antenna module and the heat dissipation sheet is disposed to correspond to the space defined by the wireless charging coil, the case securing heat dissipation performance, without degrading antenna performance and wireless charging performance, may be provided.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
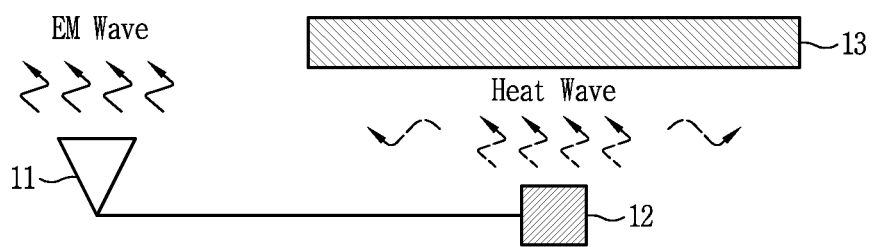
FIG. 1 is a conceptual view illustrating a heat dissipation structure of a conventional 4G antenna.
Figure 2:
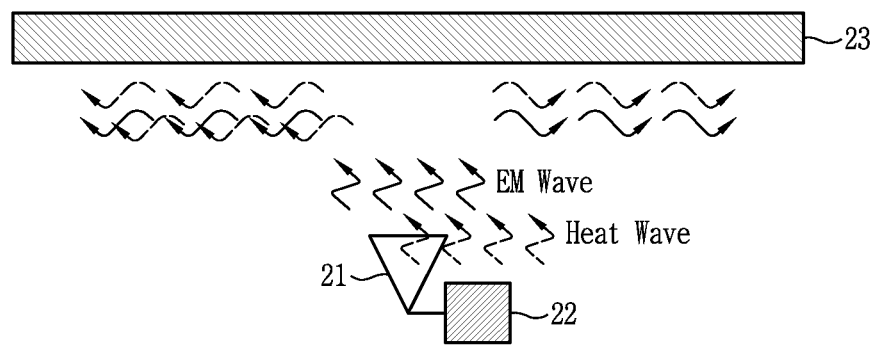
FIG. 2 is a conceptual view illustrating a problem when the structure illustrated in FIG. 1 is applied to a 5G antenna.

Hereinafter a mobile terminal related to the present disclosure will be described in detail.

In describing the present disclosure, if a detailed explanation for a related known function or construction is considered to unnecessarily divert the gist of the present disclosure, such explanation has been omitted but would be understood by those skilled in the art.

The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

A singular representation may include a plural representation unless it represents a definitely different meaning from the context.

In a modification, reference numerals which are the same as or similar to those of a previously described embodiment are used and redundant descriptions thereof will be omitted.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

Figure 3:
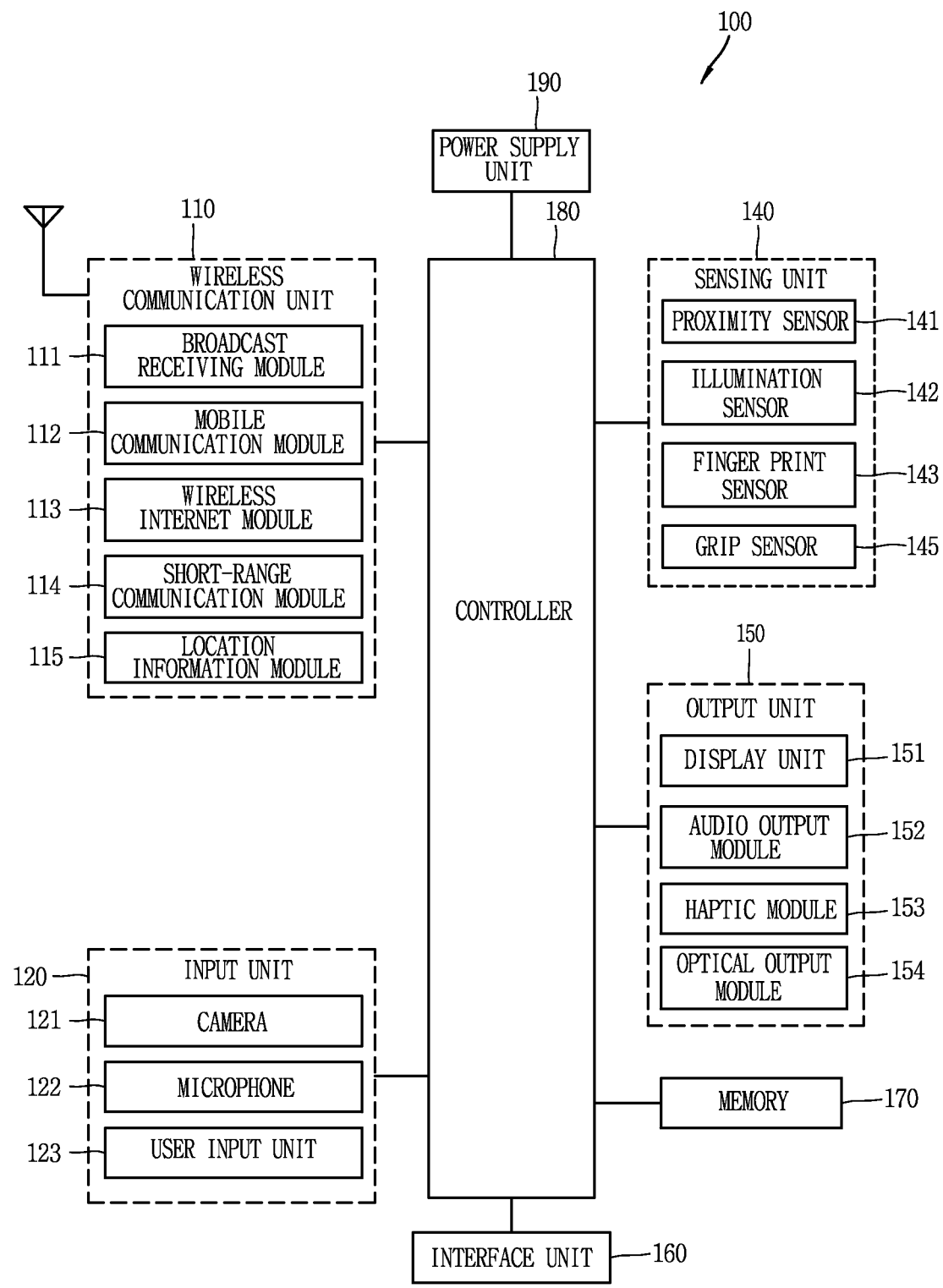
FIG. 3 is a block diagram illustrating a mobile terminal according to the present disclosure.

FIG. 3 is a block diagram illustrating a mobile terminal 100 related to the present disclosure.

The mobile terminal 100 may be shown having components such as a wireless communication unit 110, an input unit 120, a sensing unit 140, an output unit 150, an interface unit 160, a memory 170, a controller 180, and a power supply unit 190. FIG. 1 shows the mobile terminal 100 having various components, but it may be understood that implementing all of the illustrated components is not a requirement. Greater or fewer components may alternatively be implemented.

In more detail, among others, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the glass type terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the electronic device, the surrounding environment of the electronic device, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a grip sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at the time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control a combination of at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured as an embedded battery or a detachable battery.

At least part of the components may cooperatively operate to implement an operation, a control or a control method of the mobile terminal 100 according to various embodiments disclosed herein. Also, the operation, the control or the control method of the mobile terminal 100 may be implemented on mobile terminal by an activation of at least one application program stored in the memory 170.

Hereinafter, description will be given in more detail of the aforementioned components with reference to FIG. 1A, prior to describing various embodiments implemented through the mobile terminal 100.

First, regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules may be provided in the mobile terminal 100 to facilitate simultaneous reception of two or more broadcast channels, or to support switching among broadcast channels.

The mobile communication module 112 may transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

The wireless signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another electronic device, or communications between the mobile terminal and a network where another mobile terminal (or an external server) is located, via wireless area networks. One example of the wireless area networks is a wireless personal area networks.

Here, another mobile terminal may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal 100. As an example, the location information module 115 includes a Global Position System (GPS) module, a Wi-Fi module, or both. For example, when the mobile terminal 100 uses a GPS module, a position of the mobile terminal 100 may be acquired using a signal sent from a GPS satellite. As another example, when the mobile terminal 100 uses the Wi-Fi module, a position of the mobile terminal 100 may be acquired based on information related to a wireless access point (AP) which transmits or receives a wireless signal to or from the Wi-Fi module. If desired, the location information module 115 may alternatively or additionally perform a function of any of the other modules of the wireless communication unit 110 to obtain data related to the position of the mobile terminal 100. The location information module 115 is a module used for acquiring the position (or the current position) of the mobile terminal 100, and may not be limited to a module for directly calculating or acquiring the position of the mobile terminal 100.

Next, the input unit 120 is configured to permit various types of inputs to the mobile terminal 100. Examples of such inputs include image information (or signal), audio information (or signal), data or various information input by a user, and may be provided with one or a plurality of cameras 121. Such cameras 121 may process image frames of still pictures or video obtained by image sensors in a video or image capture mode. The processed image frames can be displayed on the display unit 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data may be processed in various manners according to a function being executed in the mobile terminal 100. If desired, the microphone 122 may include assorted noise removing algorithms to remove unwanted noise generated in the course of receiving the external audio signal.

The user input unit 123 is a component that permits input by a user. Such user input may enable the controller 180 to control an operation of the mobile terminal 100. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal 100, surrounding environment information of the mobile terminal 100, user information, or the like, and generates a corresponding sensing signal. The controller 180 generally cooperates with the sending unit 140 to control operations of the mobile terminal 100 or execute data processing, a function or an operation associated with an application program installed in the mobile terminal 100 based on the sensing signal. The sensing unit 140 may be implemented using any of a variety of sensors, some of which will now be described in more detail.

The proximity sensor 141 refers to a sensor to sense presence or absence of an object approaching a surface, or an object located near a surface, by using an electromagnetic field, infrared rays, or the like without a mechanical contact. The proximity sensor 141 may be arranged at an inner region of the mobile terminal 100 covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, the controller 180 may process data corresponding to proximity touches and proximity touch patterns sensed by the proximity sensor 141, and cause visual information corresponding to the processed data to be output on the touch screen. In addition, the controller 180 can control the mobile terminal 100 to execute different operations or process different data (or information) according to whether a touch with respect to the same point on the touch screen is either a proximity touch or a contact touch.

A touch sensor senses a touch (or a touch input) applied to the touch screen (or the display unit 151) using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the touch screen, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

Meanwhile, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the object in vicinity of the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

Also, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 may output a signal for indicating an event generation using light of a light source of the mobile terminal 100. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal 100 emits monochromatic light or light with a plurality of colors to a front or rear surface. The signal output may be terminated as the mobile terminal 100 senses that a user has checked the generated event, for example.

The interface unit 160 serves as an interface for every external device to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the mobile terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal 100 therethrough. Various command signals or power input from the cradle may operate as signals for recognizing that the mobile terminal 100 is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control operations relating to application programs and the general operations of the mobile terminal 100. For example, the controller 180 may set or release a lock state for restricting a user from inputting a control command with respect to applications when a status of the mobile terminal 100 meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 may control one or a combination of those components in order to implement various exemplary embodiments disclosed herein on the mobile terminal 100 according to the present invention.

The power supply unit 190 receives external power or provides internal power and supply the appropriate power required for operating respective elements and components included in the mobile terminal 100 under the control of the controller 180. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Hereinafter, an embodiment of the mobile terminal 100 having the aforementioned components will be described with reference to FIGS. 4 and 5.

Figure 4:
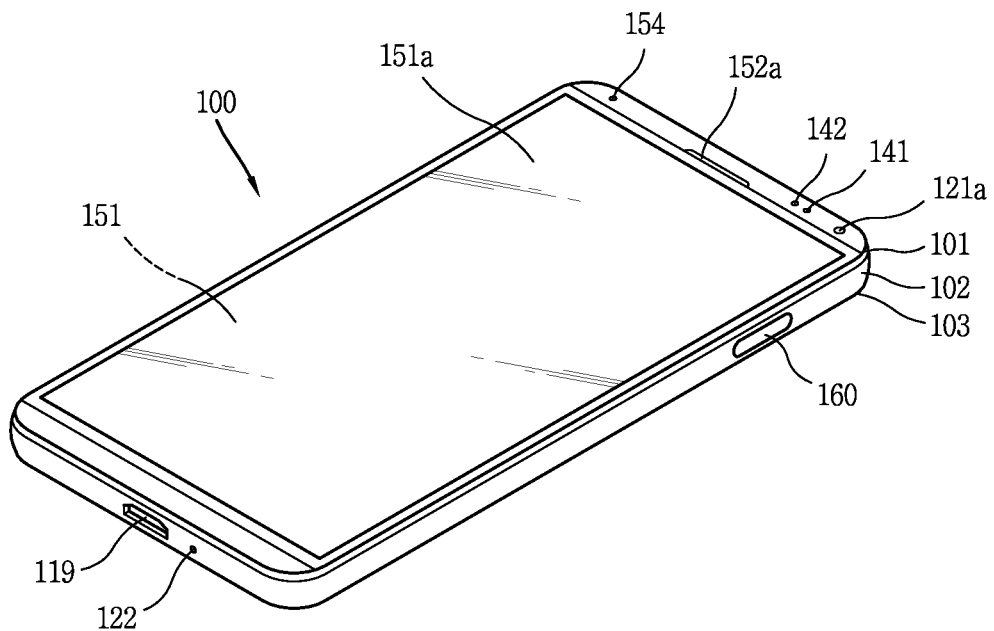
FIGS. 4 and 5 are conceptual views illustrating a mobile terminal viewed in different directions according to an embodiment of the present disclosure.
Figure 5:
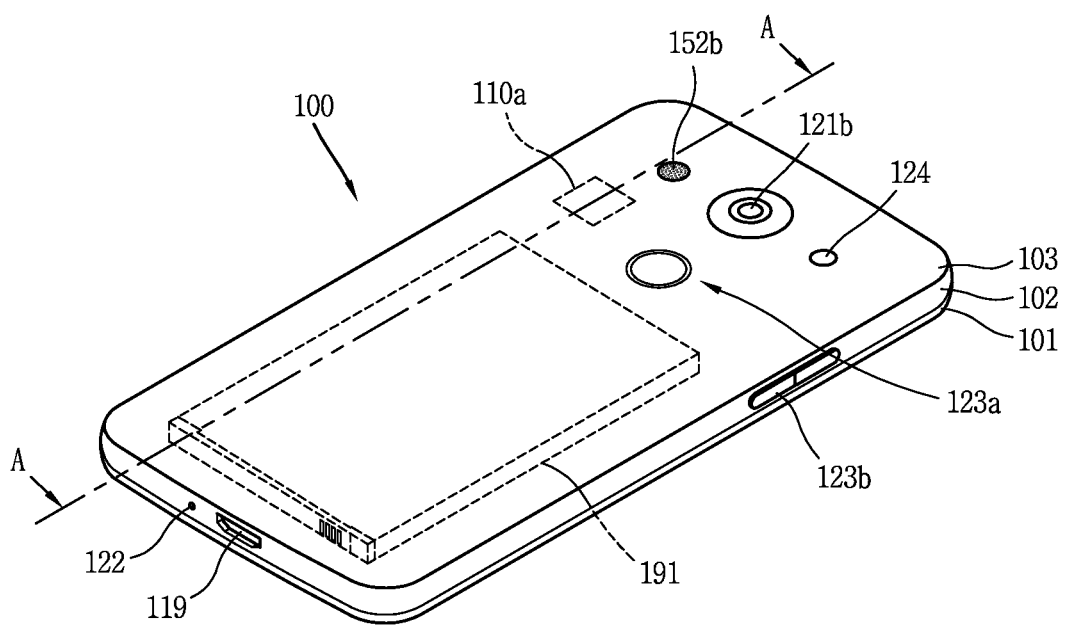

Referring to FIGS. 4 and 5, the disclosed mobile terminal 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of electronic device. However, such teachings with regard to a particular type of mobile terminal will generally be applied to other types of electronic devices as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the mobile terminal 100 may include a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. In this case, a rear cover 103 is shown covering the electronic components, and this cover may be detachably coupled to the rear case 102. Therefore, when the rear cover 103 is detached from the rear case 102, the electronic components mounted on the rear case 102 are exposed to the outside.

As illustrated, when the rear cover 103 is coupled to the rear case 102, a side surface of the rear case 102 may partially be exposed. In some cases, upon the coupling, the rear case 102 may also be completely shielded by the rear cover 103. Meanwhile, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this case, an mobile terminal 100 having a uni-body is formed in such a manner that synthetic resin or metal extends from a side surface to a rear surface.

Meanwhile, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 4 and 5, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 121a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may be located on another surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be designated.

On the other hand, the touch sensor may be configured in a form of a film having a touch pattern and disposed between a window and a display (not illustrated) on a rear surface of the window, or may be a metal wire directly patterned on the rear surface of the window. Alternatively, the touch sensor may be formed integrally with the display. For example, the touch sensor may be disposed on a substrate of the display, or may be provided inside the display.

In this way, the display unit 151 may form a touch screen together with the touch sensor, and in this case, the touch screen may function as the user input unit (123, see FIG. 1A). In some cases, the touch screen may replace at least some of functions of a first manipulation unit 123a. Hereinafter, for the sake of explanation, the display unit (display module) for outputting the image and the touch sensor are collectively referred to as a touch screen 151.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include a sound hole for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such power on/off, start, end, switching to a touch recognition mode of the display unit 151 or the like, and the second manipulation unit 123b may be used by the user to input a command, such as controlling a volume level being output from the first or second audio output module 152a or 152b, switching into a touch recognition mode of the display unit 151, or the like.

The first manipulation unit 123a may be disposed to overlap the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present invention may not be limited to this, and the position of the first manipulation unit 123a may be changeable.

When the first manipulation unit 123a is disposed on the rear surface of the terminal body, a new user interface may be implemented using the first manipulation unit 123a. In addition, the display unit 151 may be configured as a larger screen.

On the other hand, the mobile terminal 100 may include a finger scan sensor which scans a user's fingerprint. The controller 180 may use fingerprint information sensed by the finger scan sensor as an authentication means. The finger scan sensor may be installed in the display unit 151 or the user input unit 123.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection electrode for connecting to another device (for example, an earphone, an external speaker, or the like), a port for near field communication (for example, an Infrared Data Association (IrDA) port, a Bluetooth port, a wireless LAN port, and the like), or a power supply electrode for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may be arranged in a matrix form. The cameras may be referred to as an 'array camera.' When the second camera 121b is implemented as the array camera, images may be captured in various manners using the plurality of lenses and images with better qualities may be obtained.

The flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement stereophonic sound functions in conjunction with the first audio output module 152a, and may be also used for implementing a speaker phone mode for call communication.

At least one antenna for wireless communication may be disposed on the terminal body. The antenna may be embedded in the terminal body or formed in the case. For example, an antenna which configures a part of the broadcast receiving module 111 (see FIG. 3) may be retractable into the terminal body. Alternatively, an antenna may be formed in a form of film to be attached onto an inner surface of the rear cover 103 or a case including a conductive material may serve as an antenna.

The terminal body is provided with a power supply unit 190 (see FIG. 1A) for supplying power to the mobile terminal 100. The power supply unit 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 103 may be detachably coupled to the rear case 102.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display unit 151 to extend the function of the mobile terminal 100. Another example of the accessory may be a touch pen for assisting or extending a touch input onto a touch screen.

Meanwhile, as described above, the mobile terminal 100 includes at least one antenna module 110a for wireless communication. For example, the mobile terminal 100 may have an antenna structure for implementing $5^{th}$-generation wireless communication. The $4^{th}$-generation wireless communication largely uses a low band frequency of 2 GHz or less, whereas the $5^{th}$-generation wireless communication uses an (ultra) high frequency band of about 28 GHz or 39 GHz.

Communication using a low-band frequency has wide coverage with a long wavelength, but a bandwidth thereof is relatively narrow so a transmission speed is slow.

Meanwhile, communication using a high-hand frequency is relatively fast as a bandwidth is relatively wide, but coverage thereof is narrow due to a short wavelength. Such a coverage constraint may be solved by using patch antennas 110a1 having electromagnetic wave characteristics with high linearity and forming an array. Therefore, the $5^{th}$-generation wireless communication with increased capacity may provide various communication services to users.

As illustrated in FIG. 1, in the existing 4G antenna structure for existing $4^{th}$-generation wireless communication services, an integrated circuit (IC) 12 is disposed apart from an antenna 11 by a predetermined distance or greater. Here, in order to upwardly dissipate heat from the IC 12, a heat dissipation sheet 13 is arranged to cover the IC 12. In this structure, the heat dissipation sheet 13 does not cover the antenna 11, radiation of the antenna 11 is not affected.

However, in the 5G antenna structure, an IC 22 and an antenna 21 are arranged to be adjacent to each other (approximately 5 mm to 10 mm) to reduce path loss. Therefore, if a heat dissipation sheet 23 is disposed to cover the IC 22, the antenna 21 is also covered to cause a problem in which radiation of the antenna 21 is blocked.

Hereinafter, a structure in which the IC 22 and the antenna 22 are disposed to be adjacent to each other as in the 5G antenna structure for $5^{th}$ generation wireless communication services, but radiation of the antenna 21 is not blocked, while heat generated in the IC 22 is dissipated, is proposed.

Figure 6:
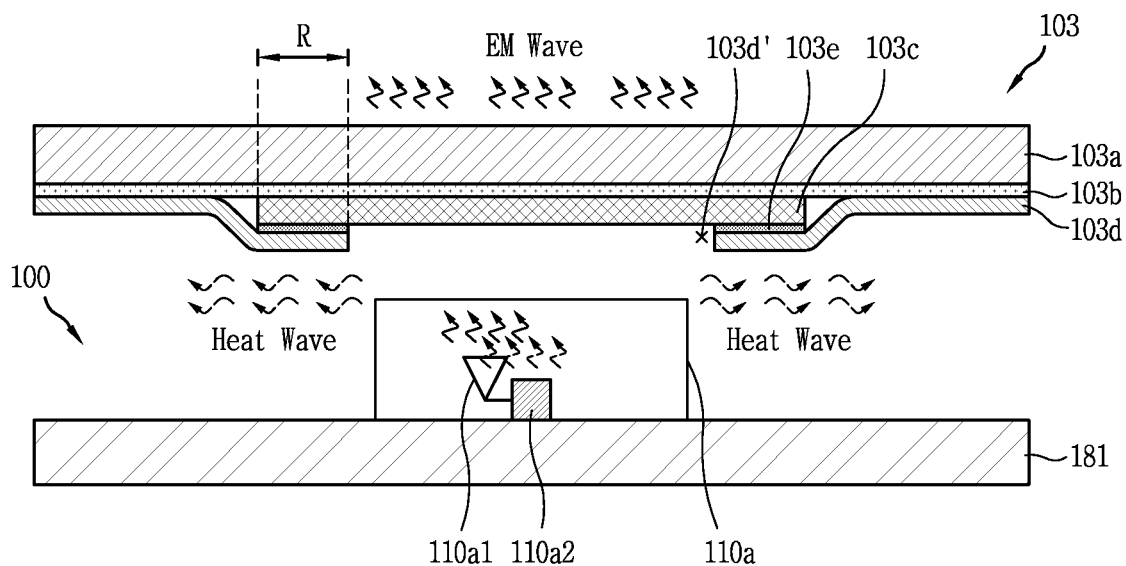
FIG. 6 is a cross-sectional view taken along line A-A of FIG. 5.
Figure 7:
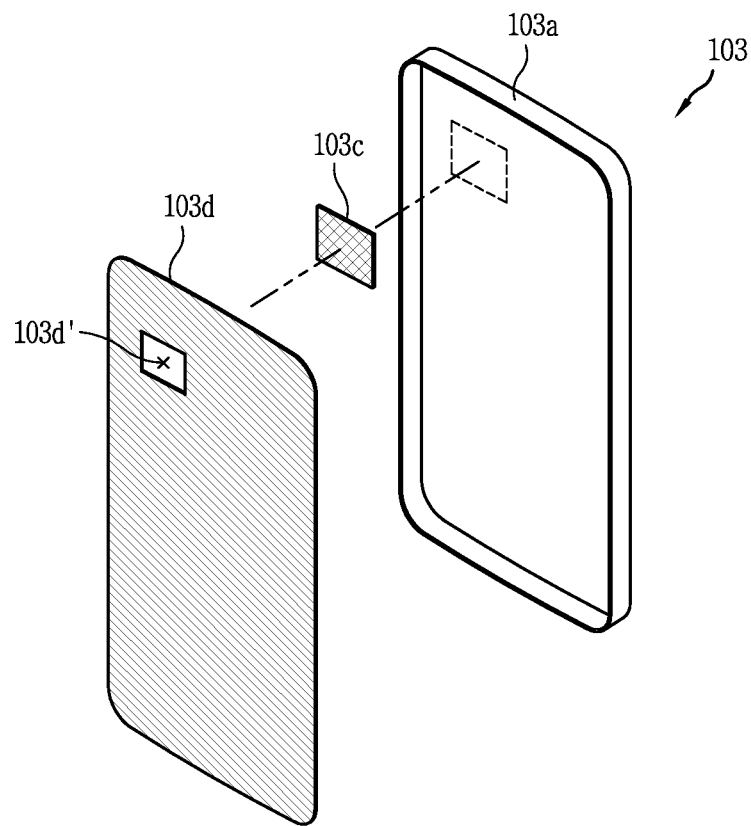
FIG. 7 is an exploded perspective view of a rear cover illustrated in FIG. 6.

FIG. 6 is a cross-sectional view taken along line A-A of FIG. 5, and FIG. 7 is an exploded perspective view of the rear cover 103 illustrated in FIG. 6.

Referring to FIGS. 6 and 7, an antenna module 110a includes patch antennas 110a1 electrically connected to a circuit board 181 and forming an array and an IC 110a2 controlling transmission and reception of radio signals of the patch antennas 110a1. For reference, in FIGS. 6 and 7, a connection relation of the antenna module 110a and the circuit board 181 and the antenna module 110a including the patch antennas 110a1 and the IC 110a2 are conceptually illustrated.

The rear cover 103 is disposed to cover the antenna module 110a. The patch antennas 110a1 transmit and receive radio signals through the rear of the mobile terminal 100, that is, through the rear cover 103. The rear cover 103 has the following structure for dissipating heat of the IC 110a2, without affecting transmission/reception of radio signals of the patch antenna 110a1.

The rear cover 103 includes a base 103a, a heat dissipation sheet 103d, and a dielectric 103c.

The base 103a forms an appearance of the rear cover 103. The base 103a may be formed of a synthetic resin material (e.g., polycarbonate) or a glass material (e.g., tempered glass).

The heat dissipation sheet 103d is adhered to an inner surface of the base 103a. The heat dissipation sheet 103d has high thermal conductivity to dissipate heat emitted upwards from the IC 110a2 in a planar direction.

The heat dissipation sheet 103d is formed of carbon or metal. For example, the heat dissipation sheet 103d may be a graphite sheet, a copper sheet, or an aluminum sheet. Among these, the graphite sheet has thermal conductivity higher than that of the copper sheet or the aluminum sheet, exhibiting high heat dissipation performance.

The graphite sheet or metal sheet, however, has high electrical conductivity as well as high thermal conductivity. Therefore, electromagnetic waves radiated from the patch antennas 110a1 to the outside of the mobile terminal 100 or electromagnetic waves received by the patch antennas 110a1 from the outside of the mobile terminal 100 may be blocked by the heat dissipation sheet 103d.

To solve this problem, an opening 103d' corresponding to the patch antennas 110a1 is formed in the heat dissipation sheet 103d. That is, as illustrated in FIG. 7, the opening 103d' overlap the patch antenna 110a1 in a thickness direction of the mobile terminal 100. Thus, transmission and reception of radio signals by the patch antennas 110a1 may be performed without interruption.

The dielectric 103c is formed of a dielectric material and is arranged to cover the opening 103d' of the heat dissipation sheet 103d. The dielectric 103c has low electrical conductivity. Thus, the dielectric 103c does not block transmission and reception of radio signals by the patch antennas 110a1. The dielectric 103c may be formed as a sheet like the heat dissipation sheet 103d.

However, the general dielectric 103c, (e.g., polycarbonate) has low thermal conductivity as well as low electrical conductivity. Thus, in the case of using the general dielectric 103c, a partial amount of heat emitted upwards from the IC 110a2 may be emitted to the outside of the rear cover 103 through the opening 103d'.

To solve this problem, a special material having low electric conductivity but high thermal conductivity may be used as the dielectric 103c. For example, the dielectric 103c may be formed of a composite material including aluminum nitride (AlN) or boron nitride (BN). Thus, the use of the dielectric 103c of a special material having high thermal conductivity may limit external emission of heat dissipated toward the opening 103d'.

As described above, the present disclosure discloses the rear cover 103 in which the heat dissipation sheet 103d is adhered to an inner surface of the base 103a, the opening 103d' is formed in a portion of the heat dissipation sheet 103d corresponding to the patch antennas 110a1, and the dielectric 103c is disposed to cover the opening 103d'. According to the rear cover 103, a heat dissipation structure of the IC 110a2 that does not affect radiation performance of the patch antennas 110a1 may be realized. Here, when the dielectric 103c is formed of a composite material containing an aluminum nitride or boron nitride having low electrical conductivity but high thermal conductivity, the dielectric 103c may exhibit heat dissipation performance comparable to that of the heat dissipation sheet 103d.

Hereinafter, a structure of the rear cover 103 illustrated in FIG. 6 will be described in detail with reference to FIGS. 8 and 9.

Figure 8:
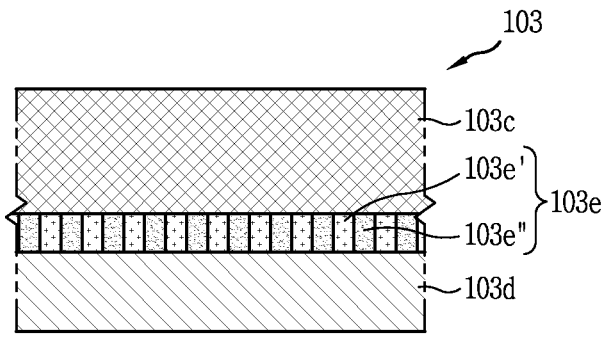
FIG. 8 is an enlarged view of a connection part illustrated in FIG. 6.
Figure 9:
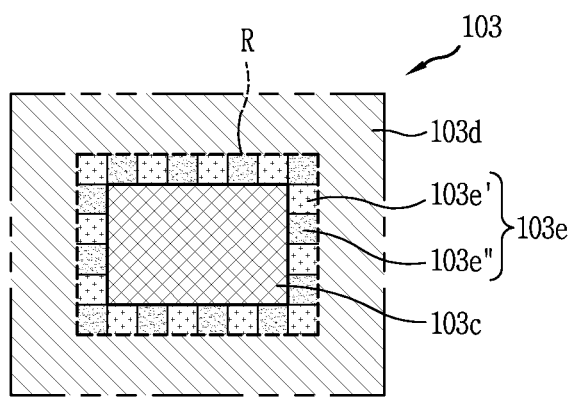
FIG. 9 is a conceptual view illustrating a rear cover to which an example of the to connection part illustrated in FIG. 8 is applied.

FIG. 8 is an enlarged view of a connection part 103e illustrated in FIG. 6, and FIG. 9 is a conceptual view illustrating the rear cover 103 to which an example of the connection part 103e illustrated in FIG. 8 is applied.

Referring to FIGS. 8 and 9 together with FIG. 6, the heat dissipation sheet 103d and the dielectric 103c are adhered to the inner surface of the base 103a by an adhesive 103b. As the adhesive 103b, various known adhesives such as a sheet type adhesive, a liquid type adhesive, and the like, may be used. Thus, a description thereof will be omitted.

The opening 103d' of the heat dissipation sheet 103d is formed smaller than the dielectric 103c and the heat dissipation sheet 103d is arranged to cover an edge region of the dielectric 103c adhered to the base 103a. Therefore, the edge region of the dielectric 103c is disposed between the base 103a and the heat dissipation sheet 103d. An overlap portion R of the heat dissipation sheet 103d overlapping the dielectric 103c is formed to protrude to the inside of the rear cover 103, relative to other portions.

The connection part 103e is disposed at the overlap portion R of the dielectric 103c and the heat dissipation sheet 103d. The connection part 103e couples the dielectric 103c and the heat dissipation sheet 103d. Here, the connection part 103e may be formed of the same type as that of the adhesive 103b mentioned above.

The connection part 103e may have a predetermined level of thermal conductivity. However, when the connection part 103e is formed of only an adhesive, it may be difficult to have the predetermined level of thermal conductivity due to low thermal conductivity of the adhesive.

In order to solve the problem, the connection part 103e may be formed of a combination of an adhesive 103e' and a thermal compound 103e''. The adhesive 103e' is applied between the dielectric 103c and the heat dissipation sheet 103d and the thermal compound 103e'' fills an empty space in the adhesive 103e'. Here, the thermal compound 103'' reduces a difference in thermal conductivity between the dielectric 103c and the heat dissipation sheet 103d.

That is, the connection part 103e may have a function of increasing heat transmission from the dielectric 103c to the heat dissipation sheet 103d by virtue of the thermal compound 103e'' in addition to a basic adhesive function based on the adhesive 103e'. Therefore, heat dissipation performance may be improved.

The adhesive 103e' and the thermal compound 103e'' may be applied in a preset pattern form in the overlap portion R. For example, as illustrated in FIGS. 8 and 9, the adhesive 103e' and the compound 103e'' may be applied alternately along the periphery of the overlap portion R.

The preset pattern may be designed in consideration of a heat dissipation direction. For example, when heat is desired to be dissipated in one direction, the thermal compound 103e'' may be applied to extend in the one direction.

The ratio of an area occupied by the adhesive 103e' and the thermal compound 103e'' in the overlap portion R may also be adjusted according to design conditions.

Figure 10:
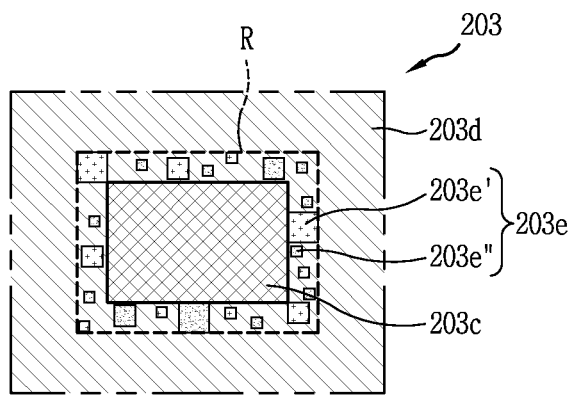
FIG. 10 is a conceptual view illustrating a rear cover to which another example of the connection part illustrated in FIG. 8 is applied.

FIG. 10 is a conceptual view illustrating a rear cover 203 to which another example of the connection part 103e illustrated in FIG. 8 is applied.

Referring to FIG. 10, when a connection part 203e includes an adhesive 203e' and a thermal compound 203e'', the adhesive 203e' and the thermal compound 203e'' may be applied randomly in the overlap portion R. For example, the adhesive 203e' may be applied only to the portion requiring adhesion, and the thermal compound 203e'' may be applied to the other remaining overlap portion R.

Figure 11:
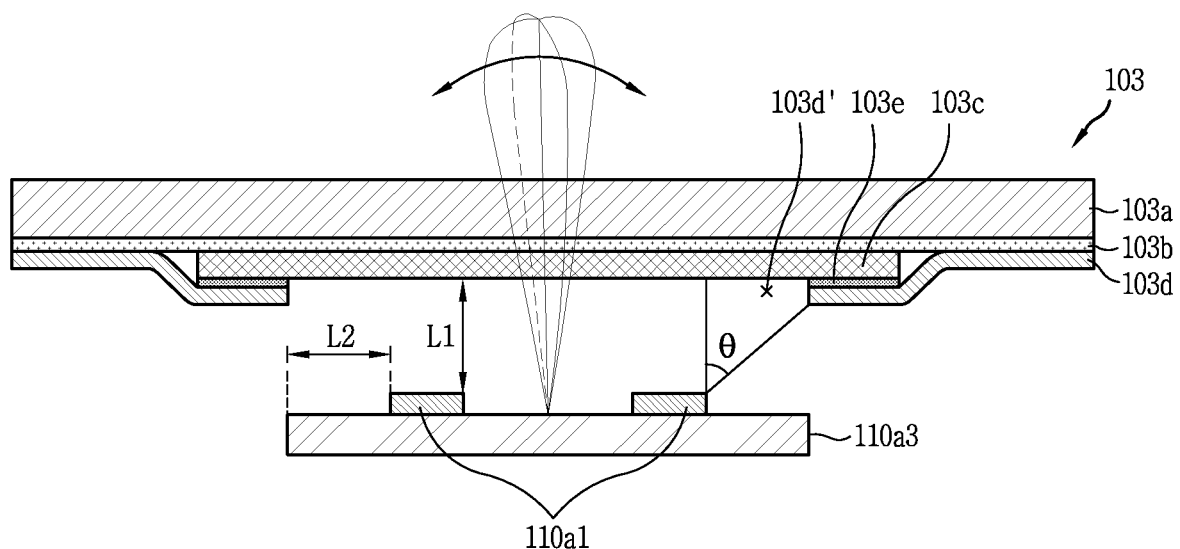
FIG. 11 is a conceptual view illustrating an arrangement condition of patch antennas illustrated in FIG. 6.
Figure 12:
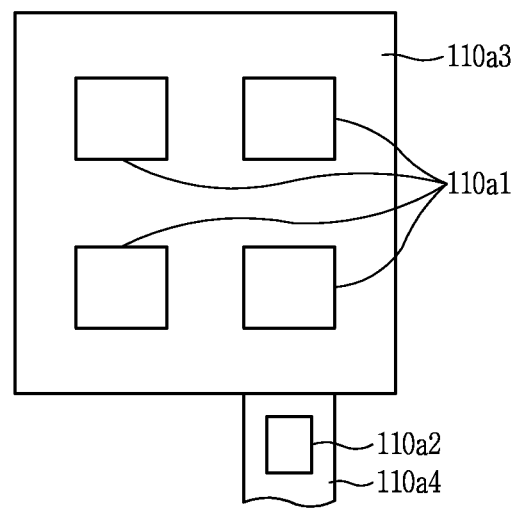
FIG. 12 is a conceptual view illustrating an antenna module illustrated in FIG. 6.

FIG. 11 is a conceptual view illustrating an arrangement condition of the patch antennas 110a1 illustrated in FIG. 6, and FIG. 12 is a conceptual view illustrating the antenna module 110a illustrated in FIG. 6.

Referring to FIGS. 11 and 12, the antenna module 110a includes the patch antennas 110a1 and the IC 110a2 which controls transmission and reception of radio signals of the patch antennas 110a1.

The patch antennas 110a1 are arranged to form an array on a substrate 110a3. In FIG. 12, it is illustrated that the patch antennas 110a1 are arranged to form a 2×2 array.

The patch antennas 110a1 may be disposed to be spaced apart from the dielectric 103c disposed to cover the opening 103d' at a preset interval L1. Preferably, the preset interval L1 is set to range from 1 mm to 3 mm.

If the preset interval L1 is less than 1 mm, the dielectric 103c may come into contact with the patch antenna 110a1 to damage the patch antenna 110a1 when the rear cover 103 is pressed. If the preset interval L1 exceeds 3 mm, a size of the opening 103d' is increased in terms of an angle condition (to be described hereinafter) to reduce heat dissipation performance and an interval between the rear cover 103 and the patch antenna 110a1 is increased to be larger than necessary to increase a thickness of the mobile terminal 100.

The patch antennas 110a1 may be disposed to be spaced apart from each other on an inner side at a predetermined interval L2 from the end of the substrate 110*a*3. For example, an interval from an outer edge of the outermost patch antenna 110*a*1 to the end of the substrate 110*a*3 may be 2.5 mm.

The IC 110*a*2 may be disposed on the substrate 110*a*3 or on a flexible printed circuit board (FPCB) 110*a*4 connected to the substrate 110*a*3 as illustrated.

As described above, the patch antennas 110*a*1 transmit and receive electromagnetic waves through the opening 103*d'*. Here, the opening 103*d'* is required to be designed not to block transmission and reception of electromagnetic waves in consideration of a scanning angle of the patch antennas 110*a*1 forming the array.

The opening 103*d'* is arranged to overlap the patch antennas 110*a*1 in a thickness direction of the rear cover 103. That is, when the opening 103*d'* is projected onto the substrate 110*a*3, the patch antennas 110*a*1 are located in a region corresponding to the opening 103*d'*. Here, an angle θ formed by the patch antennas 110*a*1 and the opening 103*d'* with respect to an axis perpendicular to the patch antennas 110*a*1 is set to be larger than a scanning angle of the patch antennas 110*a*1 constituting the array.

In general, the scanning angle of the patch antennas 110*a*1 constituting the array is set to a maximum of 60°. In consideration of this, preferably, the angle θ formed by the patch antennas 110*a*1 and the opening 103*d'* with respect to the axis perpendicular to the patch antennas 110*a*1 exceeds 60°.

In addition, since the patch antennas 110*a*1 are spaced apart from the opening 103*d'* to the inner side of the rear cover 103 at a predetermined interval, the angle θ formed by the patch antennas 110*a*1 and the opening 103*d'* should be less than 90°.

Thus, preferably, the angle θ formed by the patch antennas 110*a*1 and the opening 103*d'* with respect to the axis perpendicular to the patch antennas 110*a*1 is set to exceed 60° and less than 90°. For example, the angle θ may be 65°.

Hereinafter, modifications of the aforementioned structure will be described.

Figure 13:
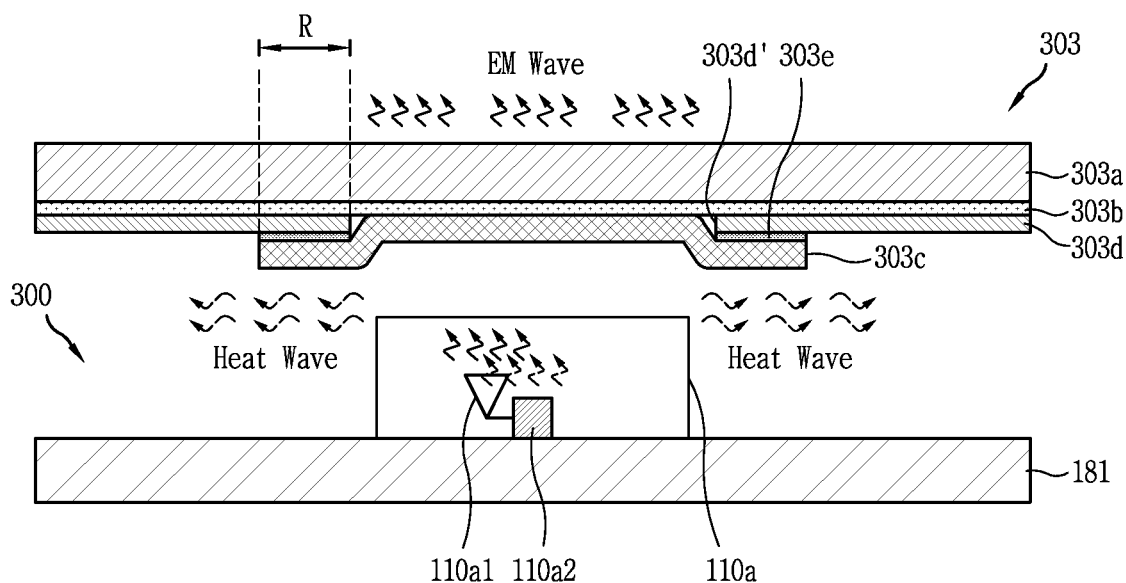
FIGS. 13 and 14 are conceptual views illustrating modifications of the rear cover illustrated in FIG. 6.
Figure 14:
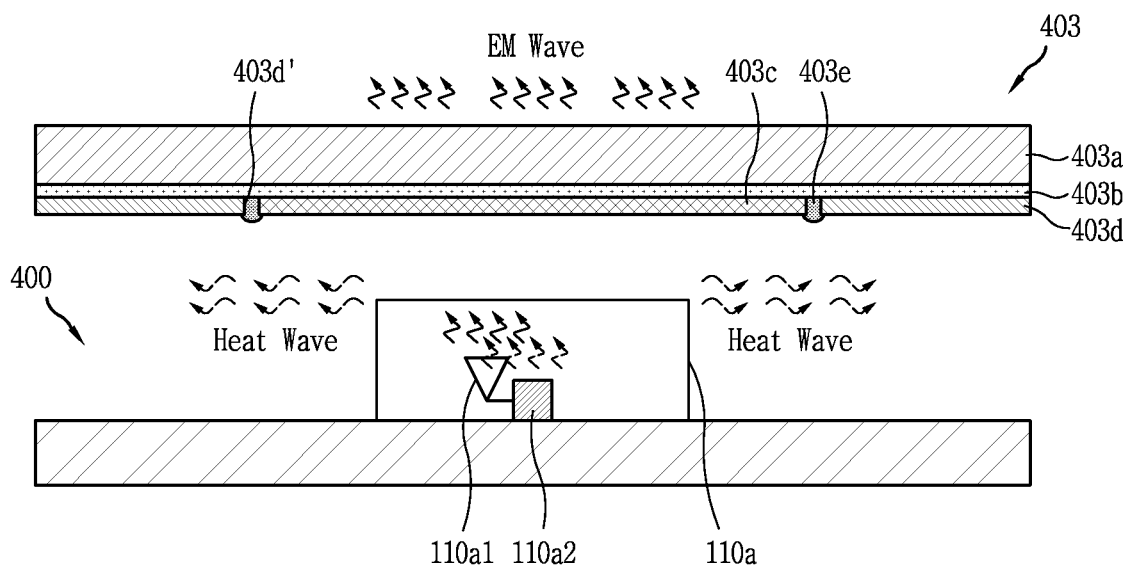

FIGS. 13 and 14 are conceptual views illustrating modifications of the rear cover 103 illustrated in FIG. 6.

First, referring to FIG. 13, a heat dissipation sheet 303*d* and a dielectric 303*c* are adhered to an inner surface of a base 303*a* by an adhesive 303*b*. As the adhesive 303*b*, various known adhesives such as a sheet type adhesive, a liquid type adhesive, and the like, may be used. Thus, a description thereof will be omitted.

The dielectric 303*c* is formed to be larger than an opening 303*d'* of the heat dissipation sheet 303*d* and the dielectric 303*c* is disposed to cover the periphery of the opening 303*d'* of the heat dissipation sheet 303*d* adhered to a base 303*a*. Therefore, the heat dissipation sheet 303*d* is disposed between the edge region of the dielectric 303*c* and the base 303*a*. An overlap portion R of the dielectric 303*c* overlapping the heat dissipation sheet 303*d* is formed to protrude to the inside of the rear cover 303, relative to other parts.

A connection part 303*e* is disposed at the overlap portion R of the dielectric 303*c* and the heat dissipation sheet 303*d*. The connection part 303*e* couples the dielectric 303*c* and the heat dissipation sheet 303*d*. Here, the connection part 303*e* may be formed of the same type of adhesive as that of the aforementioned adhesive 303*b*.

The connection part 303*e* may have a predetermined level of thermal conductivity. However, when the connection part 303*e* is formed of only an adhesive, it may be difficult to have the predetermined level of thermal conductivity due to low thermal conductivity of the adhesive.

In order to solve the problem, as described in FIGS. 8 to 10, the connection part 303*e* may be formed of a combination of an adhesive and a thermal compound. The adhesive is applied between the dielectric 303*c* and the heat dissipation sheet 303*d* and the thermal compound fills an empty space in the adhesive. Here, the thermal compound reduces a difference in thermal conductivity between the dielectric 303*c* and the heat dissipation sheet 303*d*.

That is, the connection part 303*e* may have a function of increasing heat transmission from the dielectric 303*c* to the heat dissipation sheet 303*d* by virtue of thermal compound in addition to a basic adhesive function based on the adhesive. Therefore, heat dissipation performance may be improved.

The adhesive and the thermal compound may be applied in a predetermined pattern form in the overlap portion R or may be randomly applied. A description thereof will be replaced by the description above with reference to FIGS. 8 to 10.

Next, referring to FIG. 14, a heat dissipation sheet 403*d* and a dielectric 403*c* are adhered to an inner surface of a base 403*a* by an adhesive 403*b*. As the adhesive 403*b*, various known adhesives such as a sheet type adhesive, a liquid type adhesive, and the like, may be used. Therefore, a description thereof will be omitted.

The dielectric 403*c* is formed to have a size corresponding to an opening 403*d'* of the heat dissipation sheet 403*d* and accommodated in the opening 403*d'*. That is, the dielectric 403*c* is surrounded by the opening 403*d'*. That is, unlike the foregoing two examples, there is no overlap portion between the heat dissipation sheet 403*d* and the dielectric 403*c* in this example.

As the dielectric 403*c* is accommodated in the opening 403*d'*, a gap may be formed between the opening 403*d'* and the dielectric 403*c*. The gap may form a loop along the periphery of the opening 403*d'* (or the periphery of the dielectric 403*c*).

A thermal compound 403*e* is applied in the gap, that is, between the dielectric 403*c* and the heat dissipation sheet 403*d*. The thermal compound 403*e* reduces a difference in thermal conductivity between the dielectric 403*c* and the heat dissipation sheet 403*d*. The thermal compound 403*e* may form a loop along the periphery of the opening 403*d'* (or the periphery of the dielectric 403*c*).

Figure 15:
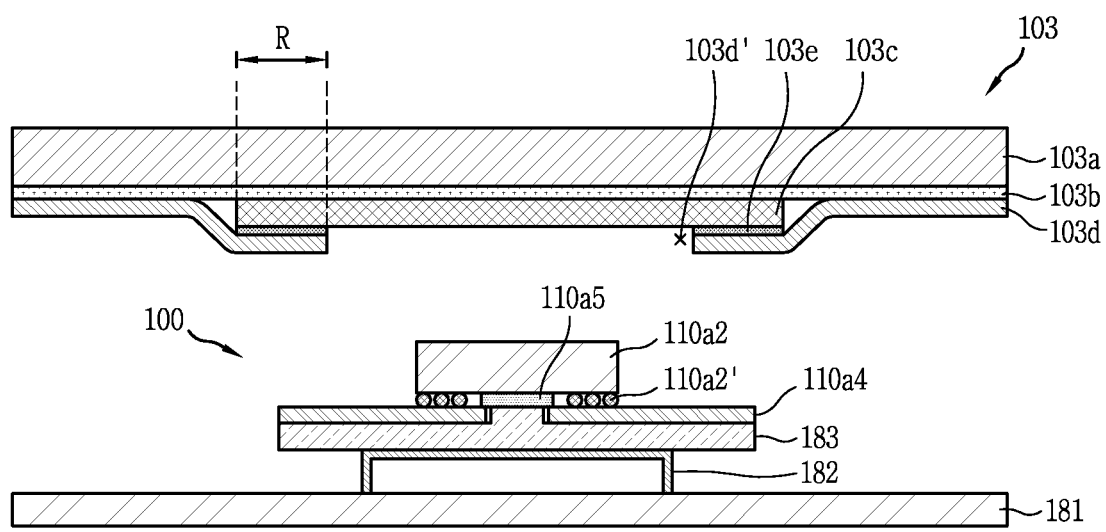
FIG. 15 is a conceptual view illustrating an example of a lower heat dissipation structure of the antenna module illustrated in FIG. 6.
Figure 16:
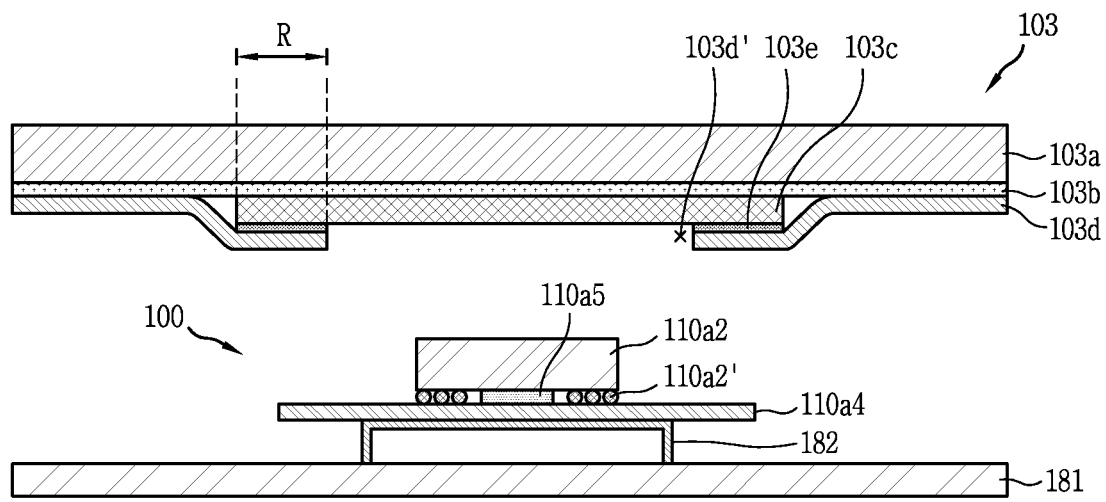
FIG. 16 is a conceptual view illustrating another example of the lower heat dissipation structure of the antenna module illustrated in FIG. 6.

Hereinafter, a lower heat dissipation structure of the antenna module 110*a* combined with the upper heat dissipation structure of the antenna module 110*a* described above will be described. FIGS. 15 and 16 illustrate the structure illustrated in FIG. 6 as the upper heat dissipation structure of the antenna module 110*a*, but the present disclosure is not limited thereto and all the structures described above may be selectively applied. For reference, in FIGS. 15 and 16, only the IC 110*a*2 is illustrated as a component of the antenna module 110*a* for the purposes of description.

FIG. 15 is a conceptual view illustrating an example of a lower heat dissipation structure of the antenna module 110*a* illustrated in FIG. 6.

Referring to FIG. 15, a circuit board 181 is disposed within the mobile terminal 100. Various electronic elements (not shown) are mounted on the circuit board 181.

A shield can 182 is disposed on the circuit board 181. The shield can 182 is formed of a metal material and may be disposed to cover at least one electronic device mounted on the circuit board 181.

A heat dissipation member 183 is disposed on the shield can 182. The heat dissipation member 183 is preferably formed of a metal material (e.g., copper).

The flexible printed circuit board (FPCB) 110a4 with the IC 110a2 mounted thereon is supported on the heat dissipation member 183. The FPCB 110a4 includes a signal via (not shown) and a ground via (not shown). A terminal 110a2' of the IC 110a2 is connected to the signal via and the ground via.

In the aforementioned arrangement, the ground via of the FPCB 110a4 is brought into contact with the heat dissipation member 183 to dissipate heat generated in the IC 110a2.

A thermal compound 110a5 may be applied between the IC 110a2 and the FPCB 110a4. Heat transmission from the IC 110a2 to the FPCB 110a4 may be increased by the thermal compound 110a5, increasing heat dissipation.

FIG. 16 is a conceptual view illustrating another example of the lower heat dissipation structure of the antenna module 110a illustrated in FIG. 6.

The circuit board 181 is disposed in the mobile terminal 100. Various electronic elements (not shown) are mounted on the circuit board 181. The circuit board 181 has a ground (not shown) for grounding or heat dissipation.

The shield can 182 is disposed on the circuit board 181, The shield can 182 is formed of a metal material and may be disposed to cover at least one electronic device mounted on the circuit board 181.

The FPCB 110a4 with the IC 110a2 mounted thereon is supported on the shield can 182. The FPCB 110a4 includes a signal via (not shown) and a ground via (not shown). The terminal 110a2' of the IC 110a2 is connected to the signal via and the ground via.

In the aforementioned arrangement, the ground via of the FPCB 110a4 are in contact with the shield can 182, and the shield can 182 is in contact with a ground of the circuit board 181 to dissipate heat generated in the IC 110a2.

The thermal compound 110a5 may be applied between the IC 110a2 and the FPCB 110a4. Heat transmission from the IC 110a2 to the FPCB 110a4 may be increased by the thermal compound 110a5, increasing heat dissipation.

As described above, heat dissipation performance of the antenna module 110a may be enhanced through the combination of the upper heat dissipation structure of the IC 110a2 and the lower heat dissipation structure including the IC 110a2, the ground via, of the FPCB 110a4, the shield can 182, and the ground of the circuit board 181, or the lower heat dissipation structure including the IC 110a2, the ground via of the FPCB 110a4, and the heat dissipation member 183.

Figure 17:
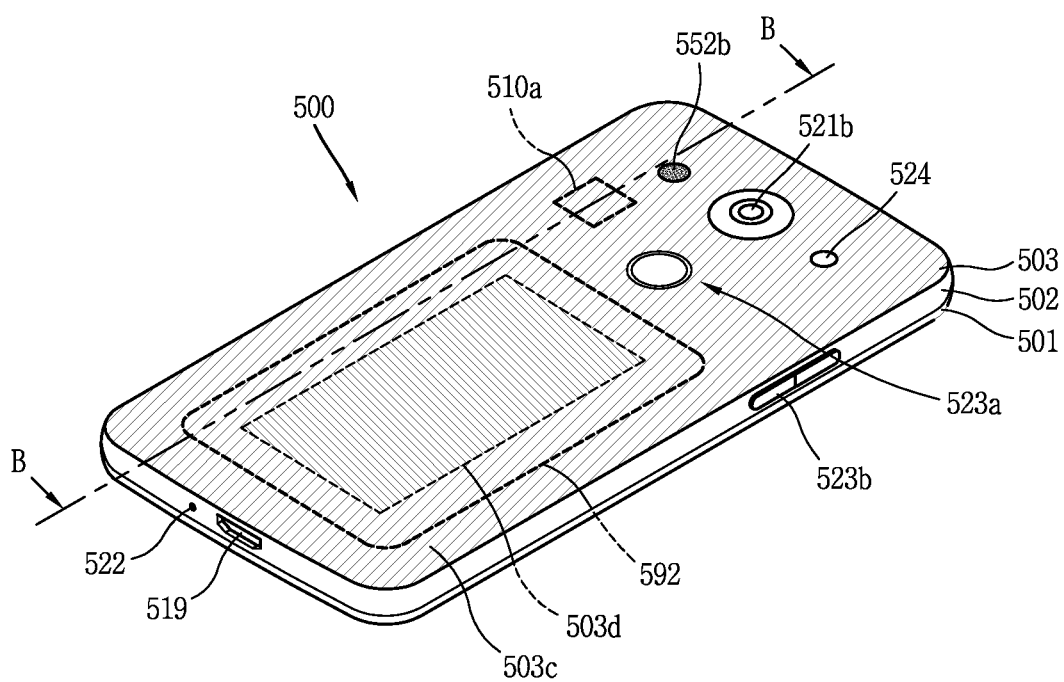
FIG. 17 is a conceptual view illustrating a mobile terminal according to another embodiment of the present disclosure.
Figure 18:
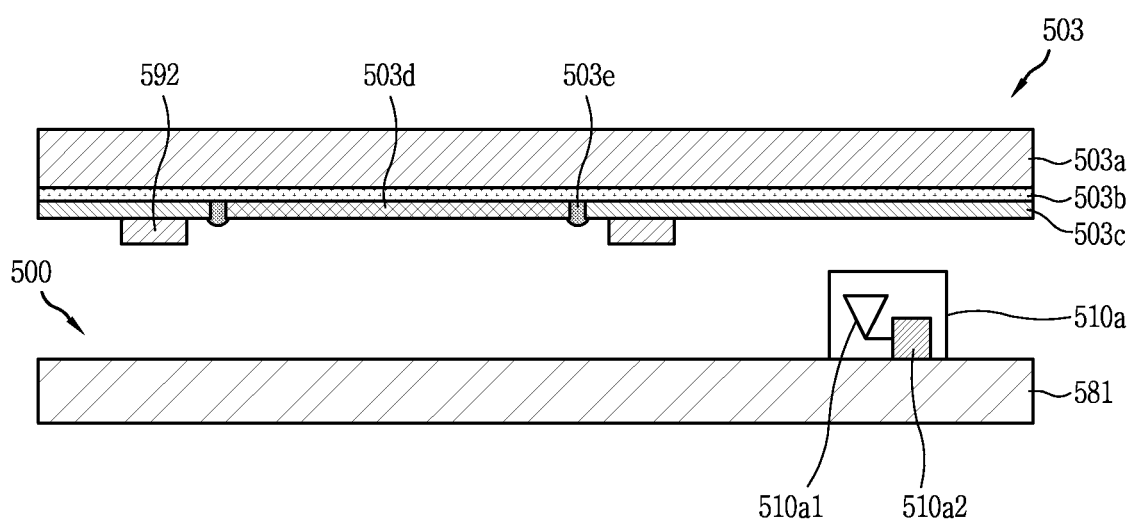
FIG. 18 is a cross-sectional view taken along line B-B of FIG. 17.

FIG. 17 is a conceptual view illustrating a mobile terminal 500 according to another embodiment of the present disclosure, and FIG. 18 is a cross-sectional view taken along line B-B of FIG. 17.

Referring to FIGS. 17 and 18, an antenna module 510a includes patch antennas 510a1 electrically connected to a circuit board 581 and forming an array and an IC 510a2 controlling transmission and reception of radio signals of the patch antennas 510a1.

A rear cover 503 is disposed to cover an antenna module 510a. The rear cover 503 includes a wireless charging coil 592 for wireless charging. The wireless charging coil 592 is disposed not to overlap the antenna module 510a in a thickness direction of the mobile terminal 500. The wireless charging coil 592 may be printed on the rear cover 503 or adhered to the rear cover 503 by an adhesive sheet.

The patch antennas 510a1 transmit and receive radio signals through the rear of the mobile terminal 500, that is, through the rear cover 503. The rear cover 503 has the following structure for dissipating heat of the IC 510a2, without affecting transmission/reception of radio signals of the patch antennas 510a1.

The rear cover 503 includes a base 503a, a heat dissipation sheet 503d, and a dielectric 503c.

The base 503a forms an appearance of the rear cover 503. The base 503a may be formed of a synthetic resin material (e.g., polycarbonate) or a glass material (e.g., tempered glass).

A heat dissipation sheet 503d is adhered to an inner surface of the base 503a. The heat dissipation sheet 503d has high thermal conductivity to dissipate heat emitted upwards from the IC 510a2, in a planar direction.

The heat dissipation sheet 503d is formed of carbon or a metal. For example, the heat dissipation sheet 503d may be a graphite sheet, a copper sheet, or an aluminum sheet. Among these, the graphite sheet has thermal conductivity higher than that of the copper sheet or the aluminum sheet, exhibiting high heat dissipation performance.

However, the graphite sheet or the metal sheet has high electrical conductivity, as well as high thermal conductivity. Therefore, electromagnetic waves generated when the patch antennas 510a1 and the wireless charging coil 592 are driven may be blocked by the heat dissipation sheet 503d.

In order to solve the problem, preferably, the heat dissipation sheet 503d is disposed not to overlap the patch antennas 510a1 and the wireless charging coil 592. For example, the heat dissipation sheet 503d may be disposed in a region defined by the wireless charging coil 592. That is, the heat dissipation sheet 503d may be surrounded by the wireless charging coil 592.

The dielectric 503c is formed of a dielectric material and has an opening corresponding to the heat dissipation sheet 503d. The dielectric 503c may be formed as a sheet like the heat dissipation sheet 503d and may be adhered to the inner surface of the base 503a and overlap the antenna module 510a and the wireless charging coil 592.

The dielectric 503c has low electrical conductivity. Therefore, electromagnetic waves generated when the patch antennas 510a1 and the wireless charging coil 592 are driven may pass through the rear cover 503, without being blocked.

However, the general dielectric 503c (e.g., polycarbonate) has low thermal conductivity, as well as low electrical conductivity. Thus, when such a general dielectric 503c is used, a partial amount of heat dissipated upwards from the IC 510a2 may be emitted to the outside of the rear cover 503 through the dielectric 503c.

To solve the problem, a special material having low electrical conductivity and high thermal conductivity may be used as the dielectric 503c. For example, the dielectric 503c may be formed of a composite material including an aluminum nitride (AlN) or a boron nitride (BN). Thus, the use of the dielectric 503c formed of the special material with high thermal conductivity may limit external emission of heat dissipated toward the dielectric 503c.

As described above, since the dielectric 503c is disposed to correspond to the wireless charging coil 592 and the 5G antenna module 510a and the heat dissipation sheet 503d is disposed in the space defined by the wireless charging coil 592, the rear cover 503 securing heat dissipation performance, without degrading antenna performance and wireless charging performance, may be provided.

The foregoing embodiments and advantages are merely exemplary and are not to be considered as limiting the present disclosure. The present teachings may be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
   a plurality of patch antennas arranged in an array;
   an integrated circuit (IC) configured to control transmission and reception of radio signals via the plurality of patch antennas;
   a heat dissipation sheet disposed above the IC and having an opening overlapping at least part of the plurality of patch antennas; and
   a dielectric member disposed at the opening and formed of a dielectric material to allow the plurality of patch antennas to transmit or receive radio signals through the opening.

2. The mobile terminal of claim 1, wherein the dielectric member is formed of a composite material comprising aluminum nitride (AlN) or boron nitride (BN).

3. The mobile terminal of claim 1, wherein the heat dissipation sheet is a graphite sheet, a copper sheet, or an aluminum sheet.

4. The mobile terminal of claim 1, wherein the dielectric member is larger than the opening such that the heat dissipation sheet is disposed to overlap an edge region of a rear surface of the dielectric member.

5. The mobile terminal of claim 4, wherein a front surface of the heat dissipation sheet and a front surface of the dielectric member are coupled to a rear surface of a base formed of a synthetic resin material or a glass material.

6. The mobile terminal of claim 4, wherein a connection part is disposed at an overlap portion of the edge region of the dielectric member and the heat dissipation sheet.

7. The mobile terminal of claim 6, wherein the connection part comprises an adhesive and a thermal compound applied between the dielectric member and the heat dissipation sheet.

8. The mobile terminal of claim 1, wherein the dielectric member is spaced apart from the plurality of patch antennas by a distance ranging from 1 mm to 3 mm.

9. The mobile terminal of claim 8, wherein an angle of an axis between an outer patch antenna of the plurality of patch antennas and a corresponding edge of the opening with respect to an axis perpendicular to the outer patch antenna is greater than a scanning angle of the plurality of patch antennas.

10. The mobile terminal of claim 9, wherein the angle is greater than 60° and is less than 90°.

11. The mobile terminal of claim 1, wherein:
    the dielectric member has a size corresponding to the opening and is accommodated in the opening; and
    a thermal compound is disposed between the dielectric member and the opening.

12. The mobile terminal of claim 11, wherein the thermal compound is disposed along a peripheral edge of the dielectric member.

13. The mobile terminal of claim 1, wherein the dielectric member is larger than the opening such that the dielectric member is disposed to overlap a periphery of the opening at a rear surface of the heat dissipation sheet.

14. The mobile terminal of claim 13, wherein a front surface of the heat dissipation sheet and a front surface of the dielectric member are coupled to a rear surface of a base formed of a synthetic resin material or a glass material.

15. The mobile terminal of claim 13, wherein a connection part is disposed at an overlap portion of the edge region of the dielectric member and the heat dissipation sheet.

16. The mobile terminal of claim 15, wherein the connection part comprises an adhesive and a thermal compound between the dielectric member and the heat dissipation sheet.

17. The mobile terminal of claim 1, further comprising:
    a circuit board;
    a shield can disposed to cover the circuit board and formed of a metal material; and
    a flexible printed circuit board (FPCB) supported on the shield can, wherein the IC is mounted on the FPCB,
    wherein a ground of the FPCB contacts the shield can and the shield can contacts a ground of the circuit board.

18. The mobile terminal of claim 17, further comprising a thermal compound between the IC and the FPCB.

19. The mobile terminal of claim 16, further comprising:
    a circuit board;
    a shield can disposed to cover the circuit board and formed of a metal material;
    a heat dissipation member supported on the shield can; and
    a flexible circuit board (FPCB) supported on the heat dissipation member, wherein the IC is mounted on the FPCB,
    wherein a ground of the FPCB contacts the heat dissipation member.

20. The mobile terminal of claim 1, wherein the plurality of patch antennas and the IC constitute a 5G antenna module.

* * * * *